US011355360B2

(12) United States Patent
Byun et al.

(10) Patent No.: US 11,355,360 B2
(45) Date of Patent: Jun. 7, 2022

(54) UNDERFILL METHOD FOR SEMICONDUCTOR PACKAGE

(71) Applicant: ENJET CO. LTD., Suwon-si (KR)

(72) Inventors: Do Young Byun, Seoul (KR); Vu Dat Nguyen, Suwon-si (KR); Yong Hee Jang, Suwon-si (KR)

(73) Assignee: ENJET CO., LTD., Suwon-si (KR)

(*) Notice: Subject to any disclaimer, the term of this patent is extended or adjusted under 35 U.S.C. 154(b) by 0 days.

(21) Appl. No.: 16/587,740

(22) Filed: Sep. 30, 2019

(65) Prior Publication Data

US 2020/0357661 A1    Nov. 12, 2020

(30) Foreign Application Priority Data

May 7, 2019   (KR) .................. 10-2019-0052762

(51) Int. Cl.
| | |
|---|---|
| *H01L 21/56* | (2006.01) |
| *H01L 21/67* | (2006.01) |
| *H01L 21/687* | (2006.01) |
| *H01L 21/683* | (2006.01) |

(52) U.S. Cl.
CPC ...... *H01L 21/563* (2013.01); *H01L 21/67126* (2013.01); *H01L 21/68764* (2013.01); *H01L 21/565* (2013.01); *H01L 21/6715* (2013.01); *H01L 21/67103* (2013.01); *H01L 21/67121* (2013.01); *H01L 21/67259* (2013.01); *H01L 21/683* (2013.01); *H01L 2924/15151* (2013.01)

(58) Field of Classification Search
CPC ..................... H01L 21/563; H01L 21/6715
See application file for complete search history.

(56) References Cited

U.S. PATENT DOCUMENTS

| | | | |
|---|---|---|---|
| 6,756,062 B2* | 6/2004 | Johnston | A61K 9/1694 424/489 |
| 2007/0048900 A1* | 3/2007 | Jiang | H01L 24/29 438/106 |
| 2014/0061902 A1* | 3/2014 | Ramalingam | H01L 21/563 257/738 |
| 2014/0177149 A1* | 6/2014 | Ramalingam | H01L 24/17 361/679.02 |
| 2014/0377916 A1 | 12/2014 | Dubey et al. | |
| 2015/0062250 A1* | 3/2015 | Byun | B05B 5/08 347/55 |
| 2017/0173945 A1* | 6/2017 | Byun | B41J 2/04548 |

FOREIGN PATENT DOCUMENTS

KR    10-2018-0117764 A    10/2018

\* cited by examiner

*Primary Examiner* — Jay C Chang
*Assistant Examiner* — Mikka Liu
(74) *Attorney, Agent, or Firm* — Saliwanchik, Lloyd & Eisenchenk

(57) ABSTRACT

Disclosed are an underfill method and apparatus for a semiconductor package, the underfill method includes loading a substrate; charging a filler to be filled in between the substrate and a device; applying the filler to the substrate; and subjecting the applied filler to an electric field.

7 Claims, 11 Drawing Sheets

(a) (b)

UNDERFILL METHOD FOR SEMICONDUCTOR PACKAGE

CROSS-REFERENCE TO RELATED APPLICATION

This application claims priority to Korean Application No. 10-2019-0052762, filed May 7, 2019, which is hereby incorporated by reference in its entirety.

BACKGROUND OF THE INVENTION

(A) Field of the Invention

The disclosure relates to an underfill method and apparatus for a semiconductor package, and more particularly to an underfill method and apparatus for a semiconductor package, in which a semiconductor device is flip-chip bonded to a substrate, and then a gap between the device and the substrate is underfilled with a filler.

(B) Description of the Related Art

In general, wire bonding, tape automated bonding (TAB), flip chip bonding, anisotropic conductive film (ACF) bonding, etc. have been known as bonding techniques applied to a semiconductor device.

In particular, a trend in electronics industry of today is towards inexpensively manufacturing and providing a product characterized in light weight, miniaturization, high speed, multi-functions, high performance, and high reliability, and therefore the technique of directly mounting a semiconductor device to a substrate, i.e. The flip-chip bonding technique has been widespread.

The flip-chip bonding technique refers to a technique that a bump is formed on an electrode pad of the semiconductor device and the semiconductor device is mounted by directing connecting the bump and the substrate.

After mounting the semiconductor device to the substrate by a flip-chip bonding method, an underfill process is performed to fill a filler (e.g. epoxy) in a flip-chip bonding portion, i.e. between the substrate and the semiconductor device so as to inhibit a bulging defect due to difference in thermal expansion coefficient between the semiconductor device and the substrate. In this case, a dispenser for applying the filler and capillary underfill for filling based on capillary action in between the semiconductor device and the substrate have been widely employed as an underfill method.

However, such a method of using the capillary action may take long time in the filling according to characteristics of solution and make incomplete filling because the filling depends on relationships with surface tension and viscosity between the semiconductor device and the substrate. In particular, when the height of the bump is lowered, the surface tension decreases as the liquid surface of the filler solution decreases, but the viscosity acting on the surfaces of the device and the substrate is not changed, thereby lowering filling speed and causing incomplete filling. The defective filling generates a void between the substrate and the semiconductor device and thus causes a fatal defect.

In terms of horizontal capillary flow, permeation of solution is expressed by the following equation.

$$\frac{dl}{dt} = \cdot \frac{r}{\eta} \frac{\gamma}{4l} \cos\theta$$

where, l is a length of a tube liquid permeates, t is time, r is a radius of the tube, η is viscosity, γ is surface tension, and θ is a contact angle. The foregoing equation shows that a ratio of a permeation length of liquid to time is in proportion to a tube size and surface tension, but inverse proportional to the permeation length and the viscosity. As learned above, when the bump is lowered and the height of the gap is decreased, a problem may arise in the permeation of the liquid.

When there is a void, a portion corresponding to the void bulges because of heat generated in a semiconductor device while a mobile phone or the like apparatus with the semiconductor device is operating. Therefore, a faulty phenomenon that the bump electrically connecting the semiconductor device and the substrate is separated may occur.

Meanwhile, when a large amount of filler is applied along the edges of the semiconductor device at once in order to inhibit the void from being formed, the applied filler may overflow and contaminate the top surface of the semiconductor device, thereby causing a problem of making it impossible to stack the semiconductor devices.

PRIOR ART BIBLIOGRAPHY

Patent Documents

Korean Patent Publication No. 10-2018-0117764

SUMMARY OF THE INVENTION

Accordingly, the disclosure is conceived to solve the foregoing problems, and an aspect of the disclosure is to provide an underfill method and apparatus for a semiconductor package, in which a filler charged on the principle of electrowetting is applied between a substrate and a semiconductor, and then subjected to an electric field, so that wetting of the filler can be controlled by electric force acting on the filler, thereby enhancing a filling efficiency.

The problems to be solved by the disclosure are not limited to those mentioned above, and other unmentioned problems will become apparent to a person skilled in the art by the following descriptions.

In accordance with an embodiment of the disclosure, there is provided an underfill method of a semiconductor package, including: loading a substrate onto a stage; charging a filler to be filled in between the substrate and a device; applying the filler to the substrate; and subjecting the applied filler to an electric field.

Here, the charging the filler may include charging the filler by applying voltage to an electrode connected to the filler.

Here, the subjecting the filler to the electric field may include generating the electric field based on an electric potential difference between the stage and a nozzle of a jetting unit for applying the filler.

In accordance with an embodiment of the disclosure, there is provided an underfill method of a semiconductor package, including: loading a substrate onto a stage; charging a filler to be filled in between the substrate and a device; and applying the filler to the substrate under a condition that a region to which the filler will be applied is subjected to an electric field.

Here, the charging the filler may include charging the filler by applying voltage to an electrode connected to the filler.

Here, the subjecting the filler to the electric field may include generating the electric field based on an electric potential difference between the stage and a nozzle of a jetting unit for applying the filler.

In accordance with an embodiment of the disclosure, there is provided an underfill method of a semiconductor package, including: loading a substrate; and applying the filler to the substrate so as to be filled in between the substrate and a device by an electrohydrodynamic jetting unit for jetting a droplet.

In accordance with an embodiment of the disclosure, there is provided an underfill apparatus for a semiconductor package, including: a stage to which a substrate is loaded; a charger configured to charge a filler to be filled in between the substrate and a device; a jetting unit configured to jet the charged filler to be applied to the substrate; and an electric field generator configured to subject the applied filler to an electric field.

Here, the jetting unit may include a nozzle obliquely disposed to jet the filler.

Here, the electric field generator may generate the electric field based on an electric potential difference between the stage and an electrode provided inside a nozzle of the jetting unit.

Here, the electric field generator may generate the electric field based on an electric potential difference between an electrode provided in the stage and an electrode provided in a nozzle of the jetting unit.

In accordance with an embodiment of the disclosure, there is provided an underfill apparatus for a semiconductor package, including: a stage to which a substrate is loaded; and an electrohydrodynamic jetting unit configured to charge a filler to be filled in between the substrate and a device and apply the filler to the substrate by force of an electric field.

Here, the electrohydrodynamic jetting unit may include a nozzle obliquely disposed to jet the filler.

Here, the electrohydrodynamic jetting unit may include: a nozzle configured to discharge a fed filler toward an opposite substrate; a main electrode not in contact with and separated from the filler inside the nozzle by an insulator; and a voltage supplier configured to supply voltage to the main electrode.

Here, the main electrode may be inserted in the nozzle as coated with the insulator.

Here, the electrohydrodynamic jetting unit may further include an induction assisting electrode coated as a conductive material on an inner wall of the nozzle and being no electric connection, being applied to different voltage from the voltage applied to the main electrode, or being grounded.

The nozzle may include the insulator, and the main electrode may be provided on an outer wall of the nozzle or at a position spaced apart from an outer side of the nozzle.

The nozzle may include a main electrode portion including a conductive material and forming a body, and an insulating portion coating the main electrode portion with an insulator, and the voltage supplier may supply voltage to the main electrode portion.

The electrohydrodynamic jetting unit may further include an induction assisting electrode inserted in the nozzle as a conductive material and being no electric connection, being applied to different voltage from the voltage applied to the main electrode, or being grounded.

The electrohydrodynamic jetting unit may further include an induction assisting electrode inserted in the nozzle as a conductive material and being no electric connection, being applied to different voltage from the voltage applied to the main electrode portion, or being grounded.

BRIEF DESCRIPTION OF THE DRAWINGS

The above and/or other aspects of the disclosure will become apparent and more readily appreciated from the following description of the exemplary embodiments, taken in conjunction with the accompanying drawings, in which.

DETAILED DESCRIPTION

Specific features of embodiments are involved in the detailed description and the accompanying drawings.

The merits and features of the disclosure, and methods of achieving them will become apparent with reference to the embodiments described below in detail and the accompanying drawings. However, the disclosure is not limited to the embodiments set forth herein, but may be implemented in various forms. The following embodiments are provided in order to fully describe the disclosure and enable those skilled in the art, to which the disclosure pertains, to understand the disclosure, the scope of which is defined in the appended claims. Like numerals refer to like elements throughout.

Below, embodiments of an underfill method and apparatus for a semiconductor package will be described with reference to the accompanying drawings.

Figure 1:
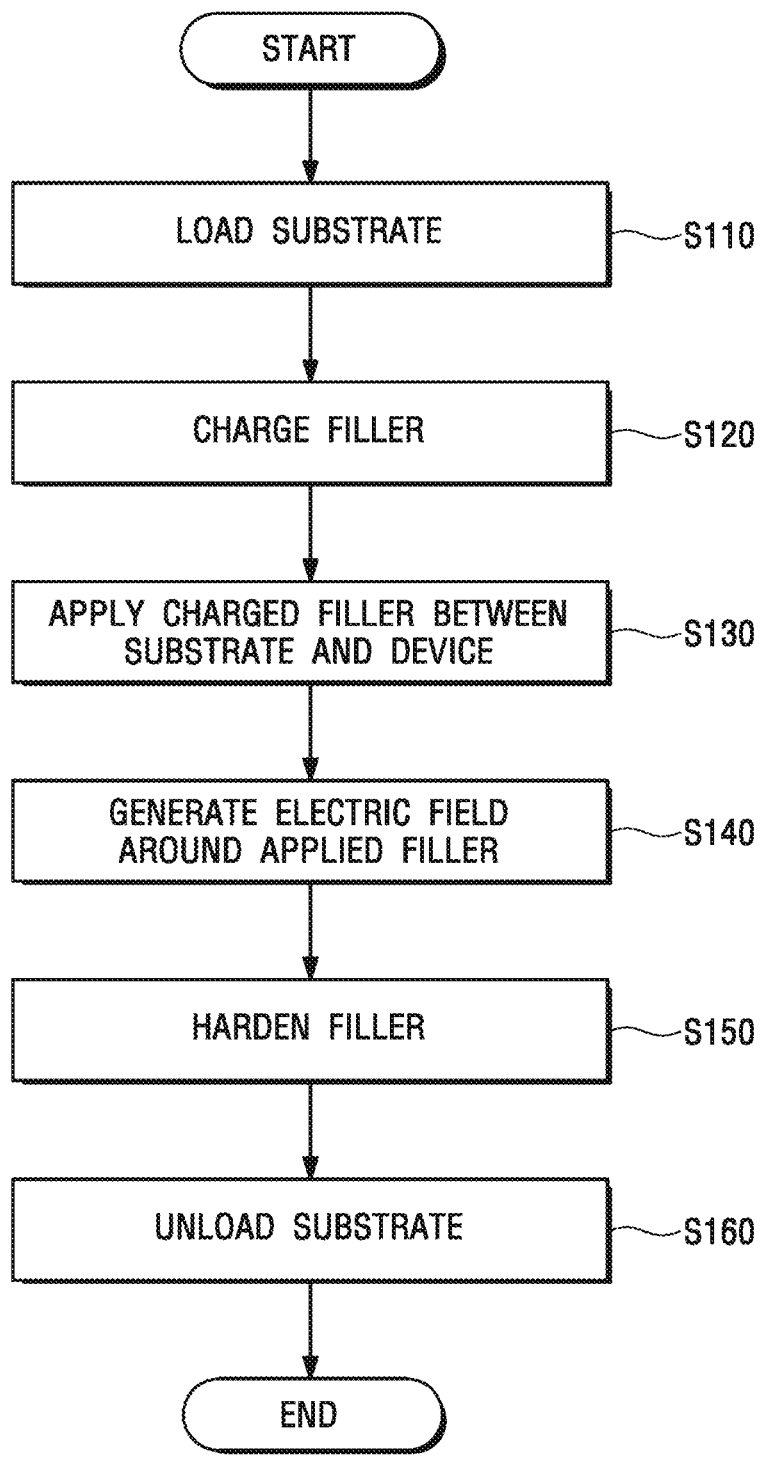
FIG. 1 is a flowchart of an underfill method of a semiconductor package according to an embodiment of the disclosure.
Figure 2:
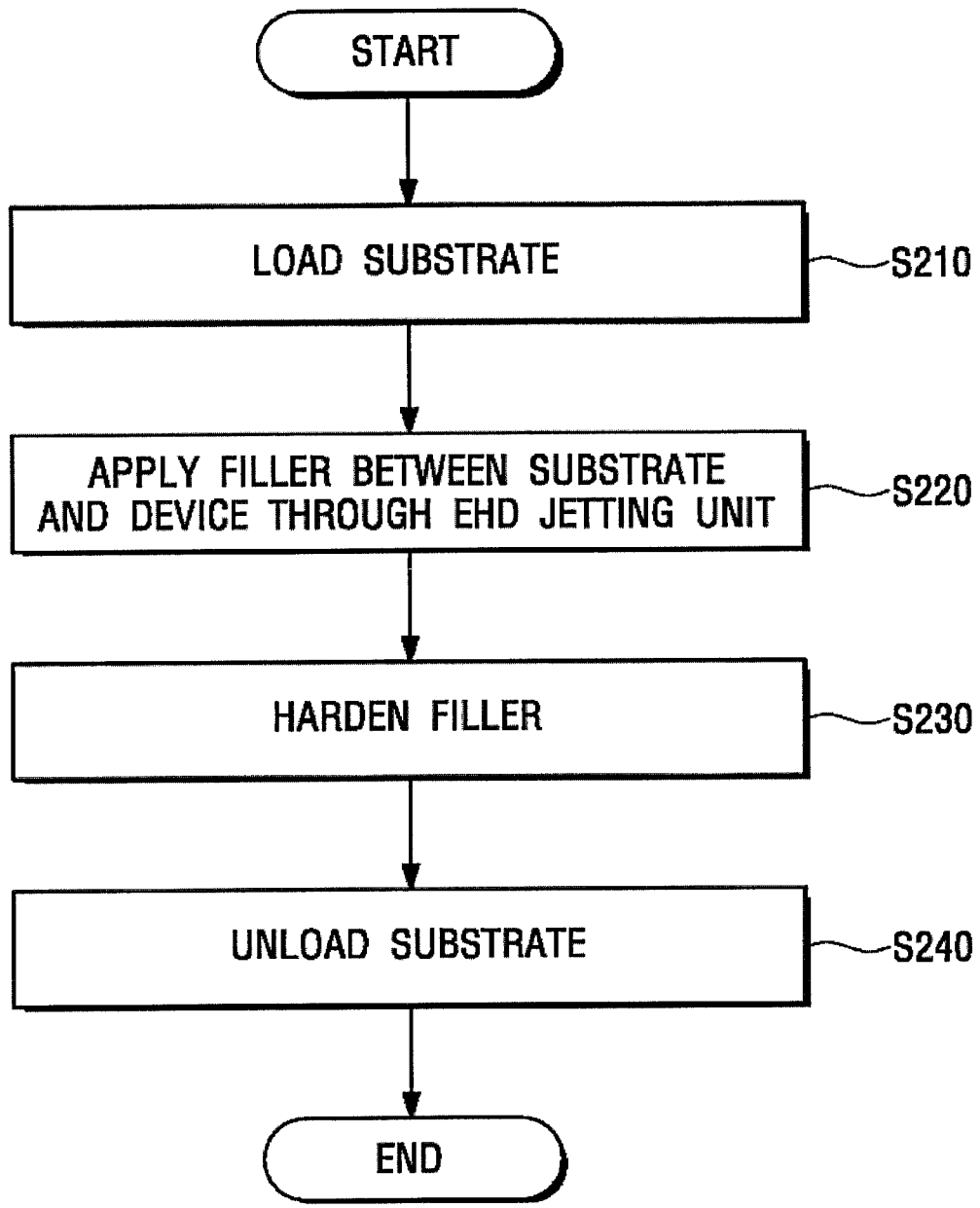
FIG. 2 is a flowchart of an underfill method of a semiconductor package according to another embodiment of the disclosure.
Figure 3:
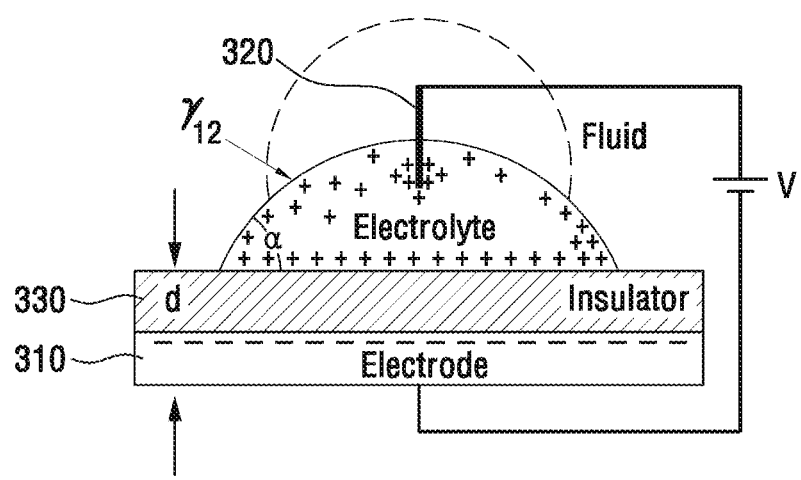
FIG. 3 is a diagram for explaining a principle of electrowetting as a basic principle of the disclosure.
Figure 4:
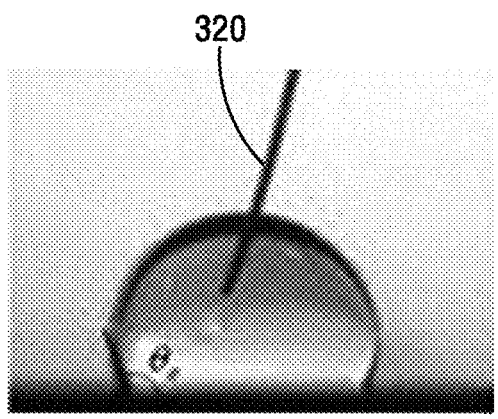
FIGS. 4(a) and (b) are photographs showing difference between a droplet subjected to an electric field and a droplet subjected to no electric fields after applying the droplet to a substrate.
Figure 4:
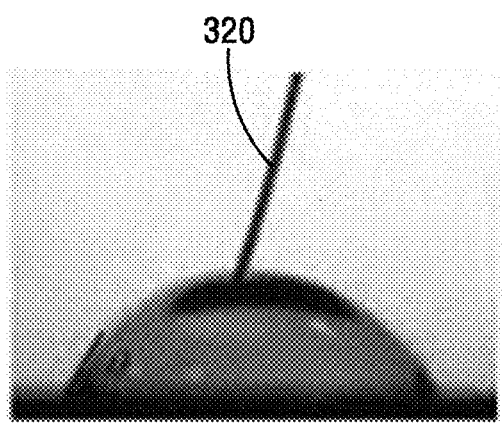
Figure 5:
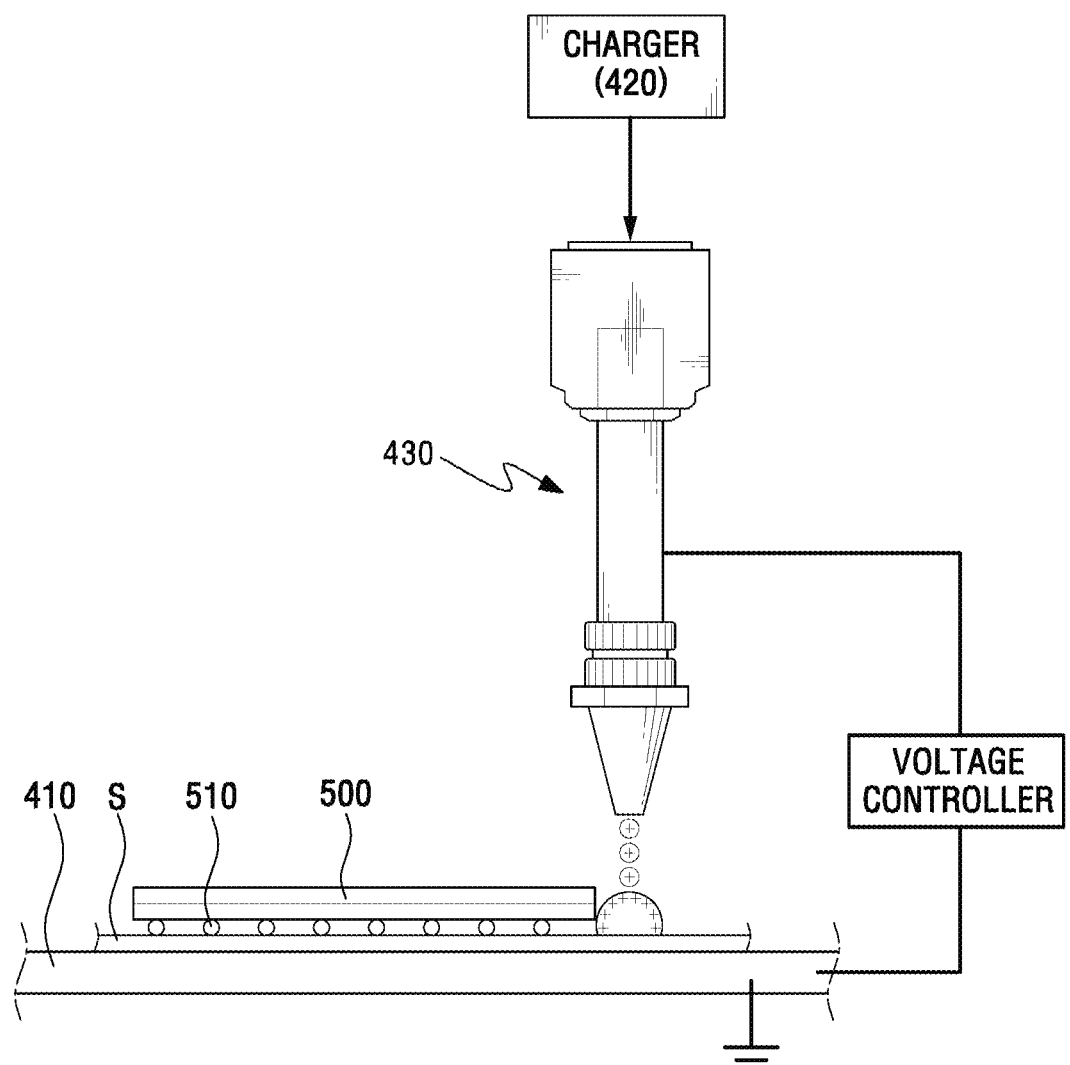
FIG. 5 shows an underfill apparatus for a semiconductor package according to an embodiment of the disclosure.
Figure 6:
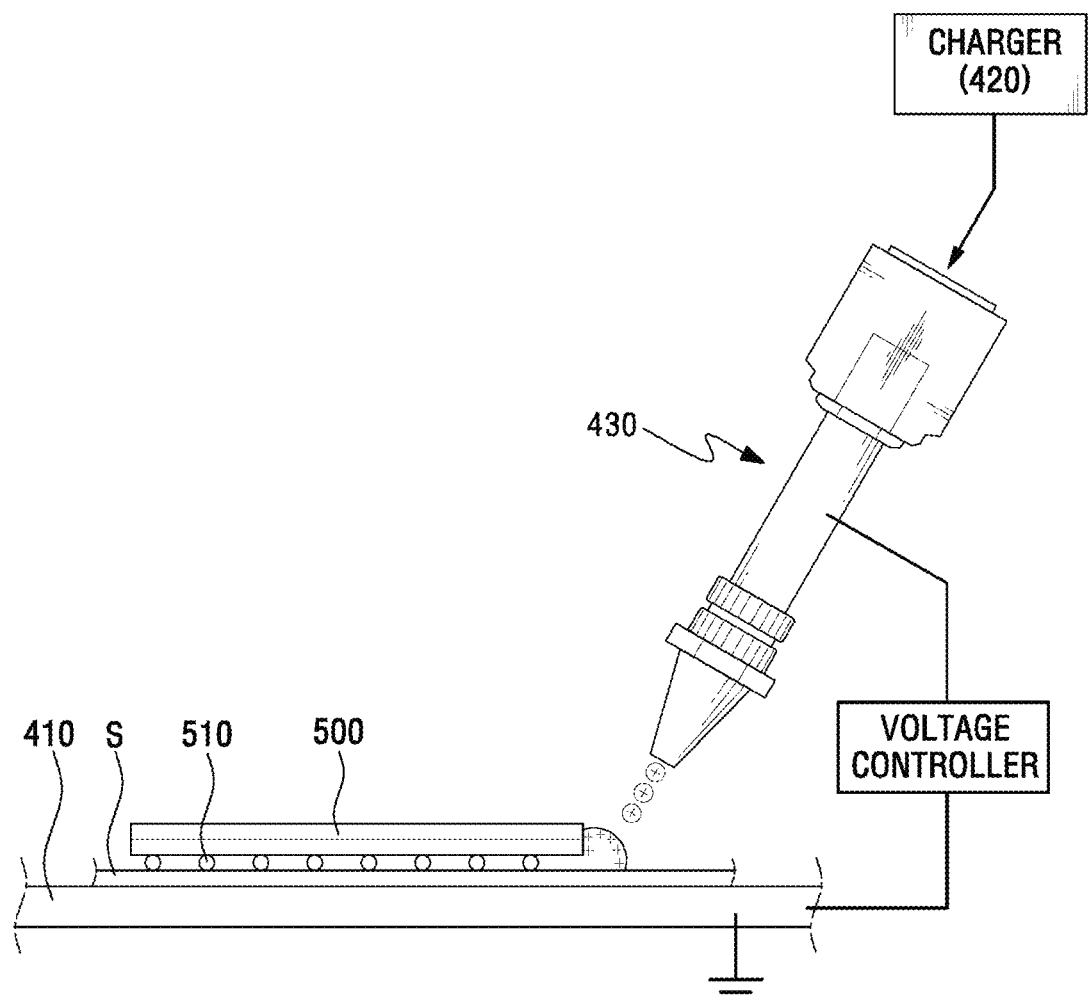
FIG. 6 shows an alternative example of FIG. 5.
Figure 7:
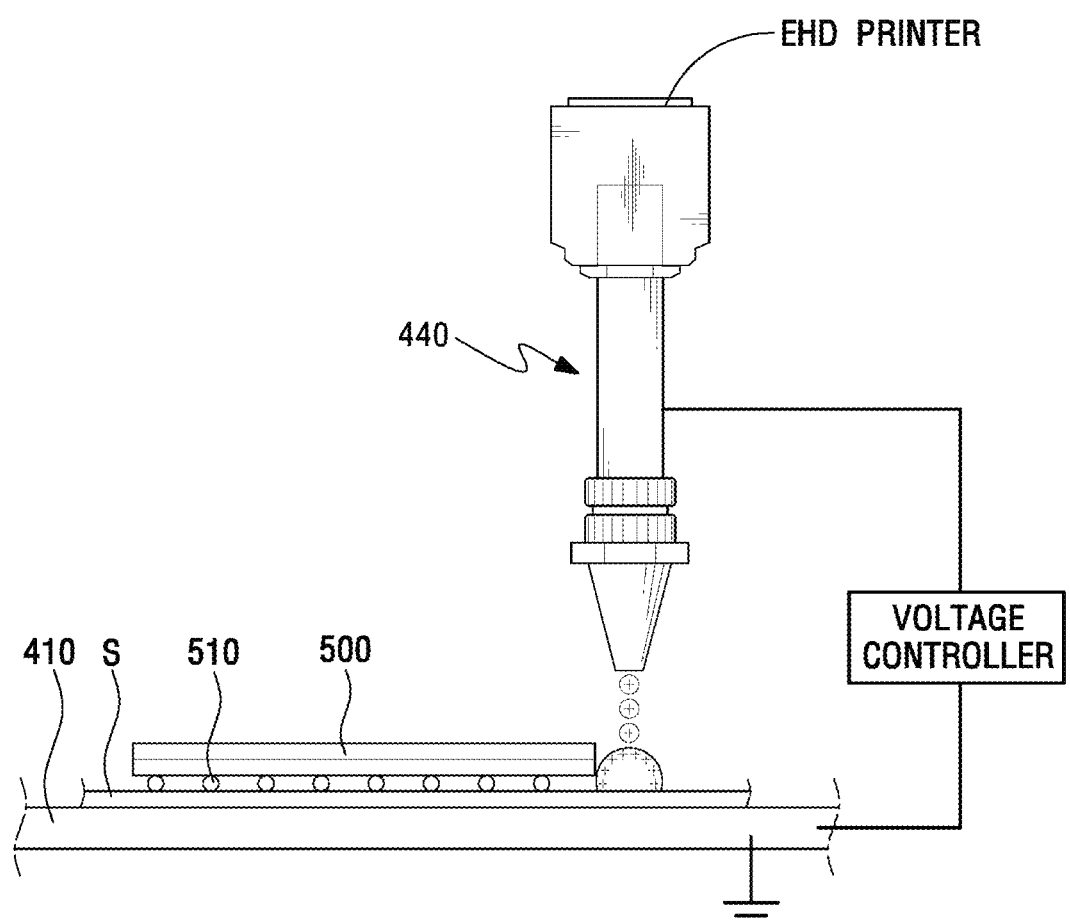
FIG. 7 shows an underfill apparatus for a semiconductor package according to another embodiment of the disclosure.
Figure 8:
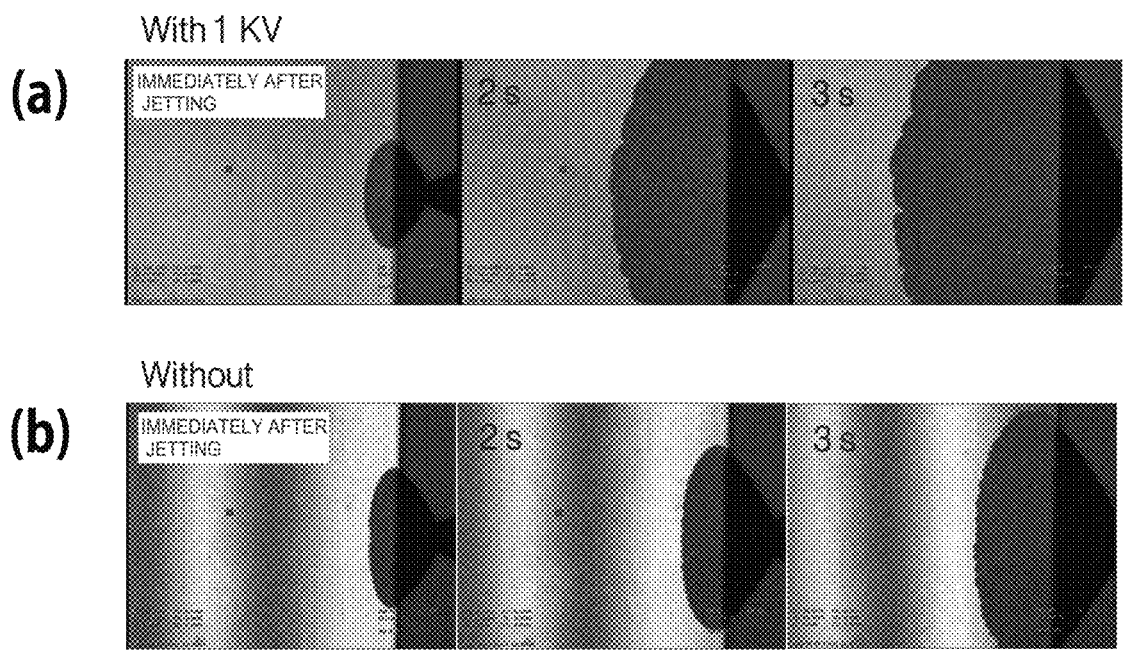
FIGS. 8(a) and (b) are photographs respectively showing filling processes as time passes when a charged filler is applied and subjected to an electric field and when no electric fields are applied.

FIG. 1 is a flowchart of an underfill method of a semiconductor package according to an embodiment of the disclosure, FIG. 2 is a flowchart of an underfill method of a semiconductor package according to another embodiment of the disclosure, FIG. 3 is a diagram for explaining a principle of electrowetting as a basic principle of the disclosure, FIGS. 4 (a) and (b) are photographs showing difference between a droplet subjected to an electric field and a droplet subjected to no electric fields after applying the droplet to a substrate, FIG. 5 shows an underfill apparatus for a semiconductor package according to an embodiment of the disclosure, FIG. 6 shows an alternative example of FIG. 5, FIG. 7 shows an underfill apparatus for a semiconductor package according to another embodiment of the disclosure, and FIGS. 8 (*a*) and (*b*) are photographs respectively showing filling processes as time passes when a charged filler is applied and subjected to an electric field and when the charged filler is applied but not subjected to the electric field.

First, an underfill method of a semiconductor package according to an embodiment of the disclosure and an apparatus for the same will be described with reference to FIGS. 1 and 5.

The underfill method of the semiconductor package according to an embodiment of the disclosure may include steps of loading a substrate S (S110), charging a filler to be filled in between the substrate S and a semiconductor device 500 (S120), applying the filler to the substrate S (S130), and subjecting the applied filler to an electric field (S140). In addition, the underfill method may further include steps of hardening the filler (S150) and unloading the substrate S (S160).

First, the substrate S made of an insulator is loaded onto a stage 410 (S110). When the substrate S is loaded onto the stage 410, a robot arm may be used to transfer the substrate S from the outside and seat the substrate S on the stage 410. In this case, the semiconductor device 500 formed with a bump 510 may be previously mounted onto the substrate S by a flip-chip bonding method. As necessary, the semiconductor device 500 may be loaded onto the stage 410 and then mounted to the substrate S by the flip-chip bonding method.

Although it is not illustrated in FIG. 5, an apparatus including the stage 410, a the jetting unit 430 for jetting a filler, etc. may be placed inside a chamber (not shown) of which inner pressure is adjustable.

Next, a charger 420 charges the filler filled in between the semiconductor device 500 and the substrate S which are mounted by the flip-chip bonding method (S120). When the bump 510 of the semiconductor device 500 is mounted to the substrate S by the flip-chip bonding method, the filler according to the disclosure has to be filled in between the substrate S and the semiconductor device 500 in a flip-chip bonding portion in order to inhibit a bulging defect due to difference in a thermal expansion coefficient between the semiconductor device 500 and the substrate S. Epoxy is used as the filler, but not limited thereto.

In this case, the filler according to the disclosure may be charged by injecting electric charges to the filler. For example, the charger 420 may charges the filler by a method of placing an electrode (not shown) inside a housing in which the filler is accommodated, and applying voltage to the electrode.

Next, the charged filler is supplied to a dispenser, a printer or the like jetting unit 430 for jetting a droplet through a nozzle, and then applied onto the substrate S through the jetting unit 430 along edges between the substrate S and the semiconductor device 500 (S130). Like this, when the filler is applied to the edges between the substrate S and the semiconductor device 500, the filler may be introduced into a gap space by a capillary action.

In this case, the jetting unit 430 may include a usual pressure-type dispenser and a jetting-type dispenser employing an actuator. The jetting-type dispenser with the actuator may include a jetting-type dispenser employing a pneumatic or solenoid valve, or a jetting-type dispenser employing a piezoelectric actuator. The charger may be added to even the existing pressure-type dispenser and the existing dispenser employing the actuator so as to charge the filler. For example, to charge the filler, the charger may include the electrode for applying the voltage to the middle of the chamber or channel for the filler. Alternatively, the charger may charge the filler by placing the electrode, an outer surface of which is coated with an insulator, in the chamber or channel, and using electric charges induced when the voltage is applied to the electrode.

Further, the charger may be placed around the nozzle of the dispenser or printer for discharging liquid or jetting a droplet, and include the electrode for applying the voltage to induce electric charges. For example, the electrode may be placed outside the nozzle and induce electronic charges to the jetted droplet.

In this case, the filler may be applied while the jetting unit 430 or the stage 410 is being transferred. Alternatively, the filter may be applied while both the jetting unit 430 and the stage 410 are being transferred. For example, a driver (not shown) for transferring the jetting unit 430 in X, Y and Z directions may be provided, or a driver (not shown) for transferring the stage 410 in the X, Y and Z directions may be provided. Further, a Z-directional driver (not shown) may be provided in the stage 410, and a XY-directional driver (not shown) may be provided in the jetting unit 430. On the contrary, the XY-directional driver (not shown) may be provided in the stage 410, and the Z-directional driver (not shown) may be provided in the jetting unit 430. In addition, the stage 410 may be horizontally rotatable.

The nozzle of the jetting unit 430 may be disposed perpendicularly to the substrate S and perpendicularly jets the filler to a lateral portion of the semiconductor device. However, as shown in FIG. 6, the nozzle may be obliquely disposed to jet the filler to a lateral wall of the semiconductor device 500.

Next, an electric field is formed around the filler applied onto the substrate S (S140). In this case, the process of applying the filler and the process of forming the electric field may be achieved at the same time. In other words, the charged filler may be applied under a condition that the electric field is formed in a region to which the filler is applied.

In this case, an electric field generator places an electrode (not shown) inside the dispenser, the printer or the like jetting unit 430 for applying the filler, and makes an electric potential difference between the electrode and the stage 410, thereby generating an electric field. In this case, the electrode may be placed inside the nozzle of the dispenser or printer, but not limited thereto. For example, the electrode may be formed on the stage of the printer or at a specific position outside the nozzle. By applying voltage to the electrode, the electric field may be formed around the stage and the substrate.

The principle of electrowetting has been known. The electrowetting is to electrostatically control a contact angle between liquid and solid. Here, the wetting of liquid may be varied depending on electricity applied to the liquid. As shown in FIG. 3, difference in voltage applied between an electrolyte and an electrode 310 placed beneath an insulator 330 decreases interfacial energy of the electrolyte, and thus increases a degree of wetting in the substrate S due to liquid. Strictly, electrostatic force is exerted by electric charges on an interface of liquid and an electric field formed around the interface, and results in decreasing the interfacial energy. It is regarded that surface tension is ultimately changed by not changing a surface tension coefficient of liquid but applying external force to the liquid. The electrowetting may be used in moving and shaping a volume of liquid. For example, when a water droplet is present on a hydrophobic surface, a contact area between the water droplet and the hydrophobic surface is minimized as shown in (a) of FIG. 4. On the other hand, when a proper voltage difference is applied between the first electrode 310 provided beneath the hydrophobic surface and a second electrode 320 provided inside the water droplet, the water droplet spreads on the hydrophobic surface while decreasing the contact angle as shown in (b) of FIG. 4. In this case, when the voltage difference disappears between the first electrode 310 and the second electrode 320, the water droplet returns to its original state. That is, the wetting of the liquid is varied depending to the applied voltage.

On the principle of the electrowetting, the Lippmann-Young equation, which expresses that the contact angle is varied depending on the voltage applied from the outside, has been known as follows.

$$\cos\alpha = \cos\alpha_0 + \frac{1}{2}\frac{\varepsilon_3}{\gamma_{12}d}V^2.$$

(where, $\varepsilon_3$ is a dielectric constant of an insulator, d is the thickness of the insulator, $\gamma_{12}$ is interfacial tension of a fluid-droplet interface, and $\alpha_0$ is a contact angle determined by each interfacial tension in a three-phase contact line (TCL) where fluid, a droplet and an insulator meet when no electric fields are applied.

In the Lippmann-Young equation, an electrowetting phenomenon is explained with a voltage applied to the droplet. Specifically, electricity acting on surface charges in the TCL serves to decrease the contact angle.

In other words, when electric charges are present on the surface of the liquid and the electric field is given around the liquid, the wetting (i.e. the surface tension) of the liquid is controllable based on the electricity acting on the liquid.

Therefore, according to the disclosure, the filler is charged and then applied to the edges between the substrate S and the semiconductor device 500, and the electric field is formed around the applied filler to control the wetting of the filler, thereby improving a filling efficiency. As the contact angle (i.e. the surface tension) of the liquid is decreased by the applied electric field, the filler can be more easily introduced into a space between the substrate S and the semiconductor.

FIG. 8 shows experimental results that a filler spreads between the substrate S and the semiconductor device 500 as time passes when the charged filler according to the disclosure is applied and subjected to an electric field with a voltage of 1 kV and when a filler is applied without electric charging by a usual dispensing method and not subjected to the electric field. In FIG. 8, a right dark portion indicates a droplet applied onto the substrate S, and the filler penetrates leftward over a straight line. As shown in FIG. 8, when the electric field is given according to the disclosure, a spreading speed of the filler in the space between the substrate S and the semiconductor device 500 is much faster. Therefore, according to the disclosure, the charged filler is jetted and then subjected to the electric field, so that the filler having the improved wetting can be more easily introduced into the space between the substrate S and the semiconductor device 500.

Next, after a predetermined period of time passes, the filler is hardened (S150). In this case, the stage 410 to which the substrate S is loaded may include a heating stage 410 in which temperature control is supported. Therefore, the viscosity of the filler to be applied onto the substrate S may be adjusted by controlling the temperature of the stage 410. Further, the temperature control may be properly made when the filler is hardened.

Last, when the filler is completely hardened, the substrate S is unloaded by the robot arm (S160).

Below, an underfill method of a semiconductor package and an apparatus for the same according to another embodiment of the disclosure will be described with reference to FIGS. 2 and 7. In the following, description will be made focusing difference from the foregoing method and the apparatus for the same.

According to another embodiment of the disclosure, the underfill method of the semiconductor package includes steps of loading a substrate S (S210); and applying a filler to the substrate S through a jetting unit 440 for jetting a droplet by an electrohydrodynamic method so as to be filled in between the substrate S and the device 500 (S220). In addition, the underfill method may further include steps of hardening the filler (S230) and unloading the substrate S (S240).

Conventionally, a printer and a dispenser based on electrohydrodynamics (EHD) have been known. The EHD jetting technique refers to a technique of applying electricity to liquid and jetting the liquid based on electric force acting on a liquid surface. This method is characterized in jetting a droplet much smaller than those of other inkjet printers or dispensing techniques, and further applies electric charges to the droplet during a jetting process.

In general, the EHD printer and the like electrohydrodynamic jetting unit charges a droplet supplied to a nozzle with high voltage applied through an electrode provided in the nozzle, and discharges the droplet by force of an electric field formed by an electric potential difference between the electrode provided in the nozzle and an electrode placed beneath the substrate S outside the nozzle.

This technique may combine with other inkjet printers or dispensing techniques in the form of a hybrid. For example, the electrode may be provided inside or around the nozzle of the existing pneumatic or piezoelectric inkjet printer or dispenser, so that a droplet can be charged by high voltage, thereby improving jetting performance of the droplet. Because the disclosure has a purpose of solving the conventional underfill problems through the charged filler, the electrohydrodynamic jetting unit according to the disclosure may include not only the electrohydrodynamic jetting unit based on only the EHD but also a hybrid jetting unit employing the EHD technique.

Therefore, when the electrohydrodynamic jetting unit 440 is used in the underfill process according to the disclosure, the step of injecting electric charges to the filler, the step of applying the charged filler, and the step of applying the electric field to the applied filler may be performed simultaneously. In the electrohydrodynamic jetting unit, when voltage for charging is applied to the electrode provided inside the nozzle, the filler is charged inside the nozzle and at the same time the electric field is formed in between the nozzle and the substrate S. Thus, when the voltage is applied to the electrode, the step of charging the filler, the step of jetting a droplet for the underfill, and the step of forming the electric field may be performed at once.

Although it is not illustrated, the underfill apparatus of FIGS. 5 to 7 may include an optical curing unit or a thermal curing unit to harden the applied filler.

Further, to accurately apply the filler between the substrate S and the semiconductor device 500, or precisely monitor the applied filler, a camera may be provided to show an enlarged applied portion.

Further, to maintain a distance between the nozzle of the jetting unit 430 or 440 and the substrate S, a displacement sensor may be provided to measure the distance between the nozzle and the substrate S.

Further, a robot arm may be mounted to load the substrate S to the stage 410 and unload the substrate S of which underfill is completed.

Further, a shutter may be formed to partition a work space, and a loading/unloading space in order to perform work under an enclosed condition.

Below, the electrohydrodynamic jetting unit usable for the underfill apparatus of the semiconductor package according to the disclosure will be described in detail with reference to FIGS. 9 to 11.

Figure 9:
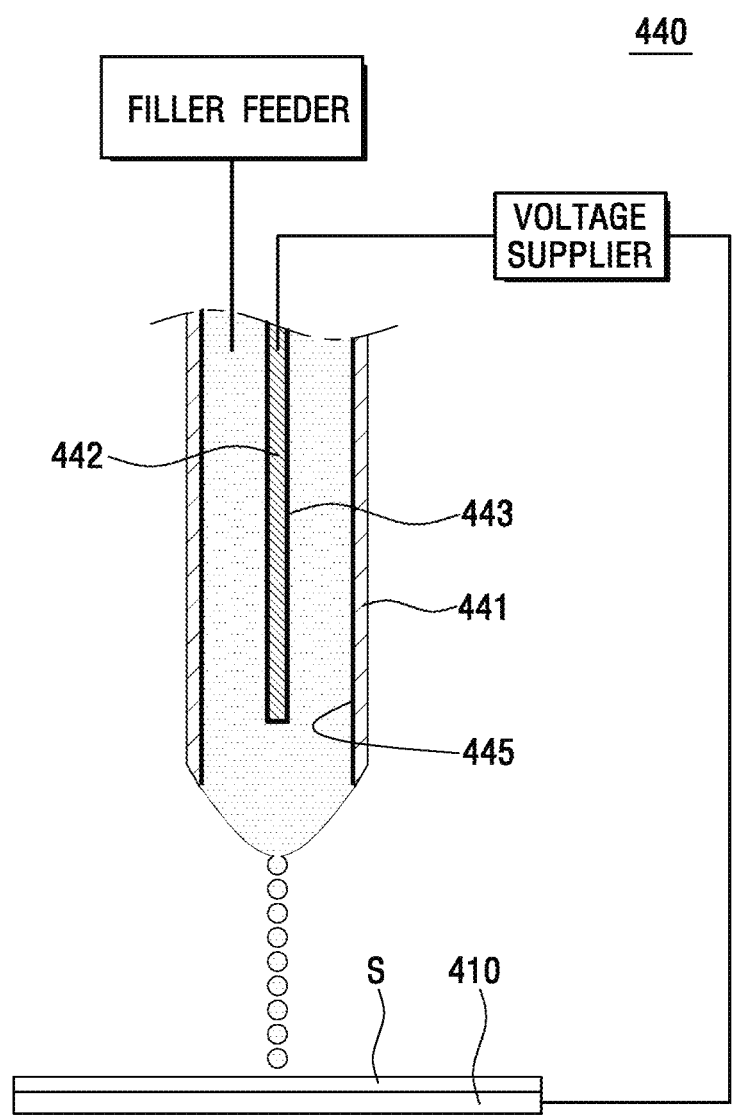
FIG. 9 shows an embodiment of an electrohydrodynamic the jetting unit, which can be used in an underfill apparatus for a semiconductor package of the disclosure.
Figure 10:
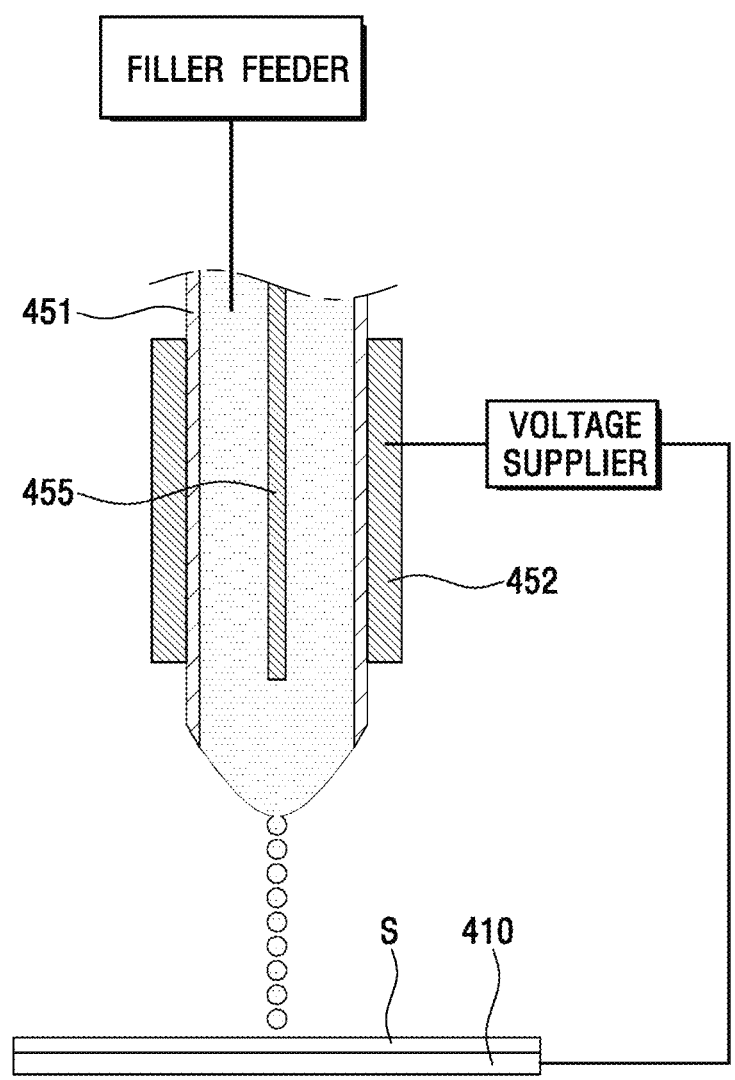
FIG. 10 shows another embodiment of FIG. 9.
Figure 11:
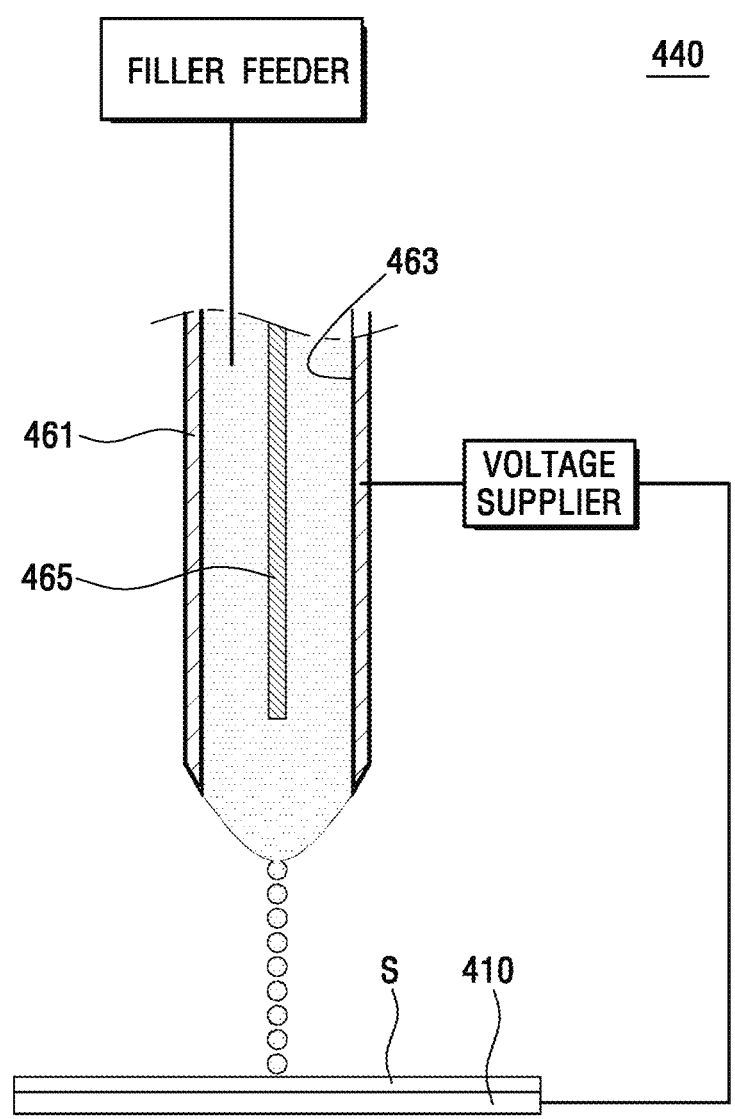
FIG. 11 shows still another embodiment of FIG. 9.

FIG. 9 shows an embodiment of an electrohydrodynamic the jetting unit, which can be used in an underfill apparatus for a semiconductor package of the disclosure, FIG. 10 shows another embodiment of FIG. 9, and FIG. 11 shows still another embodiment of FIG. 9.

As shown in FIG. 9, the electrohydrodynamic jetting unit 440 used for the underfill apparatus for a semiconductor package according to an embodiment of the disclosure may include a nozzle 441, a main electrode 442, and a voltage supplier. Further, the electrohydrodynamic jetting unit 440 may further include an induction assisting electrode 445.

The nozzle 441 receives the filler from the filler feeder and discharges the filler by induced electrostatic force through a nozzle hole formed at a bottom end thereof.

The filler feeder feeds the filler to the inside of the nozzle 441 by predetermined pressure, and may include a pump, a valve, etc.

The main electrode 442 is inserted in the center of the nozzle 441 and receives direct current (DC) or alternating current (AC) voltage from the voltage supplier. The main electrode 442 may be provided in the form of a needle as shown in FIG. 9.

In this case, according to this embodiment, the main electrode 442 is coated with an insulator, thereby forming an insulating layer 443. Therefore, the main electrode 442 and the filler inside the nozzle 441 are separated by the insulating layer 443 without direct contact. Because the filler inside the nozzle 441 is separated from the main electrode 442 by the insulating layer 443, it is possible to inhibit an oxidation-reduction reaction between the filler and the main electrode 442 when high voltage is supplied to the main electrode 442, thereby solving problems of heat generation caused by the oxidation-reduction reaction, denaturation of the filler, bubble generation, clogging of the nozzle 441, etc.

The voltage supplier supplies the DC or AC voltage to the main electrode 442 placed inside the nozzle 441. In this case, the voltage supplied by the voltage supplier may have various waveforms of a sinusoidal wave, a chopping wave, a square wave, etc.

In this case, when the AC voltage is applied between the filler and the main electrode 442 separated by the insulating layer 443, electric charges may be induced in the filler on the sample principle of generating a displacement current when voltage is applied to a capacitor.

In this case, the induction assisting electrode 445 may be additionally provided inside the nozzle 441. In more detail, the induction assisting electrode 445 may be formed by coating the inner surface of the nozzle 441 with a conductive material. Alternatively, the nozzle may be made of a conductive material. In this case, the induction assisting electrode 445 may not have separate electric connection, apply voltage different from that of the main electrode 442, or be grounded.

In such a case where the induction assisting electrode 445 is provided inside the nozzle 441 separately from the main electrode 442, an induced electric field is further enhanced and thus jetting characteristics are improved when the AC voltage is supplied to the main electrode 442 and an electric current is induced in the filler.

In this case, the surface of the induction assisting electrode 445 is also coated with the insulator, thereby inhibiting direct contact with the filler inside the nozzle 441.

Further, even when the DC voltage is supplied from the voltage supplier to the main electrode 442, electric charges may be induced on a liquid surface, thereby discharging the filler by induced electromotive force.

As shown in FIG. 10, the electrohydrodynamic jetting unit 440 according to another embodiment of the disclosure may include a nozzle 451, a main electrode 452 and a voltage supplier. Further, an induction assisting electrode 455 may be further provided. In the following, description will be made focusing difference from the embodiment described with reference to FIG. 9.

In this embodiment, the main electrode 452 may be formed on the outer surface of the nozzle 451, or disposed at a position spaced apart at a predetermined distance from the outer surface of the nozzle 451, and receives DC or AC voltage from the voltage supplier. In this case, the main electrode 452 may be formed by coating the outer surface of the nozzle 451 with an electrically conductive material.

Therefore, according to this embodiment, the nozzle 451 is made of the insulator, and the main electrode 452 is provided outside the nozzle 451, so that the filler in the nozzle 451 and the main electrode 452 can be separated by the nozzle 451 made of the insulator like that in the foregoing embodiment of FIG. 9. In this case, when the AC voltage is supplied from the voltage supplier to the main electrode 452, the filler is discharged through a nozzle hole by force of an electric field exerted as the induced current flows in the filler inside the nozzle 451. Alternatively, when the DC voltage is supplied from the voltage supplier to the main electrode 452, the filler is discharged by electric force exerted as electric charges are induced on a liquid surface of the filler at the end of the nozzle 451.

Even in this embodiment, like the foregoing embodiment, the induction assisting electrode 455 may be provided. As shown in FIG. 10, the induction assisting electrode 455 may be made of a conductive material, and inserted in the nozzle 451 in the form of a needle, and may not have separate electric connection, apply voltage different from that of the main electrode 452, or be grounded. Alternatively, the induction assisting electrode 445 may be made of a conductive material, and inserted in the nozzle 451 in the form of a tube, and may not have separate electric connection, apply voltage different from that of the main electrode 452, or be grounded. Alternatively, the induction assisting electrode 445 may be made of a conductive material, and inserted in the nozzle 451 in the form of a flat plate, and may not have separate electric connection, apply voltage different from that of the main electrode 452, or be grounded.

Like the foregoing embodiment, the induction assisting electrode 455 enhances the induced electric field and further improvises the jetting characteristics when electric current is induced by the AC voltage applied to the main electrode 452. In this embodiment, the induction assisting electrode 455 is also coated with the insulator.

As shown in FIG. 11, the electrohydrodynamic jetting unit 440 according to another embodiment of the disclosure may include the nozzle and the voltage supplier. Further, an induction assisting electrode 465 may be additionally provided. The following embodiment will be described focusing difference from the foregoing embodiments.

In this embodiment, the nozzle includes a main electrode portion 461 and an insulating portion 463. The main electrode portion 461 is made of a conductive material and forms the body of the nozzle. The insulating portion 463 is formed as the outer surface of the main electrode portion 461 is coated with an insulator. In this case, the insulating portion 463 may be formed at only a side forming the inner diameter of the nozzle, and may be entirely formed throughout the outer surface of the main electrode portion 461 forming the body of the nozzle as shown in FIG. 11.

Therefore, the main electrode portion 461 made of the conductive material and forming the body of the nozzle may serve as the main electrodes 442 and 452 of the foregoing embodiments. By the insulating portion 463 formed on the outer surface of the main electrode portion 461, the filler in the nozzle is not in direct contact with but separated from the main electrode portion 461. Thus, when AC voltage is supplied from the voltage supplier to the main electrode portion 461, the filler is discharged through a nozzle hole by force of an electric field induced as induced electric current flows in the filler inside the nozzle. Further, when DC voltage is supplied from the voltage supplier to the main electrode portion 461, electric charges are induced on a liquid surface and the filer is also discharged by induced electromotive force.

The induction assisting electrode 465 may be formed having the same shape as that in the embodiment of FIG. 10.

As described above, in an underfill method and apparatus for a semiconductor package according to the disclosure, wetting of a filler is controlled by applying an electric field to the charged filler based on the principle of electrowetting, thereby having advantages of improving a filling efficiency.

The scope of the disclosure is not limited to the foregoing embodiments, but may be actualized by various embodiments within the appended claims. It will be appreciated by any person having an ordinary skill in the art to which the disclosure pertains that various changes can be made without departing from the gist of the disclosure claimed in the appended claims.

What is claimed is:

1. An underfill method of a semiconductor package, comprising:
   charging a filler;
   applying the charged filler to a substrate on which a device is mounted along sides of the device; and
   subjecting the applied filler to an electric field so that the applied filler is easily introduced into a space between the substrate and the device without any voids or overflows of the filler by controlling a wettability of the charged filler by an electric force.

2. The underfill method according to claim 1, wherein the charging the filler comprises charging the filler by applying voltage to an electrode connected to the filler.

3. The underfill method according to claim 1, wherein the subjecting the filler to the electric field comprises generating the electric field based on an electric potential difference between the stage and a nozzle of a jetting unit for applying the filler.

4. An underfill method of a semiconductor package, comprising:
   charging a filler; and
   applying the charged filler to a substrate on which a device is mounted along sides of the device under a condition that a region to which the filler will be applied is subjected to an electric field so that the applied filler is easily introduced into a space between the substrate and the device without any voids or overflows of the filler by controlling a wettability of the charged filler by an electric force.

5. The underfill method according to claim 4, wherein the charging the filler comprises charging the filler by applying voltage to an electrode connected to the filler.

6. The underfill method according to claim 4, wherein the subjecting the filler to the electric field comprises generating the electric field based on an electric potential difference between the stage and a nozzle of a jetting unit for applying the filler.

7. An underfill method of a semiconductor package, comprising:
   applying a filler to a substrate on which a device is mounted along sides of the device by an electrohydrodynamic jetting unit for jetting a droplet, which charges liquid supplied to a nozzle with high voltage applied through an electrode provided in the nozzle and discharges the droplet by force of an electric field formed by the electrode, so that the applied filler is easily introduced into a space between the substrate and the device without any voids or overflows of the filler by controlling a wettability of the charged filler by an electric force.

* * * * *